US008073526B2

(12) United States Patent
Graham et al.

(10) Patent No.: US 8,073,526 B2
(45) Date of Patent: Dec. 6, 2011

(54) METHOD AND SYSTEM FOR COMPUTERIZED DRAWING AND WRITING DURING FUNCTIONAL MAGNETIC RESONANCE IMAGING

(75) Inventors: Simon James Graham, Toronto (CA); Richard Mraz, Toronto (CA); Nicole Baker, Toronto (CA); Ian Clarkson, Cobourg (CA); Fred Tam, Toronto (CA)

(73) Assignee: Sunnybrook Health Sciences Centre, Toronto (CA)

( * ) Notice: Subject to any disclaimer, the term of this patent is extended or adjusted under 35 U.S.C. 154(b) by 1167 days.

(21) Appl. No.: 11/707,266

(22) Filed: Feb. 16, 2007

(65) Prior Publication Data

US 2008/0200796 A1    Aug. 21, 2008

(51) Int. Cl.
*A61B 5/055* (2006.01)
(52) U.S. Cl. ........ 600/411; 600/407; 600/410; 600/413; 600/415; 600/418
(58) Field of Classification Search .................. 600/407, 600/410, 411, 413, 415, 416, 418, 421, 422, 600/425–429
See application file for complete search history.

(56) References Cited

U.S. PATENT DOCUMENTS

| | | | | |
|---|---|---|---|---|
| 5,053,757 | A * | 10/1991 | Meadows ....................... | 345/173 |
| 5,938,163 | A | 8/1999 | Gotham et al. ................ | 248/371 |
| 5,956,020 | A | 9/1999 | D'Amico et al. ............ | 345/173 |
| 6,018,336 | A | 1/2000 | Akiyama et al. .............. | 345/173 |
| 6,234,979 | B1 | 5/2001 | Merzenich ..................... | 600/559 |
| 6,240,201 | B1 | 5/2001 | Xu et al. ........................ | 382/130 |
| 6,315,569 | B1 | 11/2001 | Zaltman et al. ............... | 434/236 |
| 6,317,617 | B1 | 11/2001 | Gilhuijs et al. ............... | 600/408 |
| 6,591,128 | B1 | 7/2003 | Wu et al. | |
| 6,738,049 | B2 | 5/2004 | Kiser et al. .................... | 345/173 |
| 6,901,277 | B2 | 5/2005 | Kaufman et al. ............. | 600/407 |
| 6,996,261 | B2 | 2/2006 | deCharms | |
| 2005/0043614 | A1 * | 2/2005 | Huizenga et al. ............. | 600/427 |
| 2005/0267357 | A1 * | 12/2005 | Rao et al. ....................... | 600/411 |
| 2005/0273017 | A1 * | 12/2005 | Gordon .......................... | 600/544 |
| 2005/0288571 | A1 * | 12/2005 | Perkins et al. ................ | 600/407 |

FOREIGN PATENT DOCUMENTS

WO    WO 00/33244    6/2000

OTHER PUBLICATIONS

An fMRI study of the Trail Making Test, Zakzamis et al, Neuropsychologia 43 (2005) 1878-1886 Mar. 13, 2005 Elsevier Ltd.

* cited by examiner

*Primary Examiner* — Tse Chen
*Assistant Examiner* — Mark Remaly
(74) *Attorney, Agent, or Firm* — Lynn C. Schumacher; Hill & Schumacher

(57) ABSTRACT

The present invention provides a method and device to record and visualize drawing and writing movements during functional magnetic resonance imaging (fMRI) of brain activity. The system includes a touch-sensitive tablet, an elevated mounting platform, a stylus, and a controller box, as well as the necessary cabling and software. All equipment residing inside the magnet room is non-ferromagnetic and does not interfere with scanner operation and does not affect fMRI data quality. Individuals lying inside the scanner interact with device in a natural, intuitive way, similar to writing with pen and paper. Drawing motions captured by the tablet are displayed through a pair of fMRI-compatible goggles or by using a projector and screen. Other visual stimuli can be concurrently presented with the drawing motions for the purpose of assessing specific aspects of human behavior. The system allows for a plurality of experiments to be performed, all while brain activity is measured and recorded.

30 Claims, 7 Drawing Sheets

Elevational views of the fMRI-compatible drawing tablet.

Example uses for the fMRI-compatible drawing tablet include a) traditional neuropsychological assessments (pen-and-paper tests), b) rating scales and c) as a generic computer input peripheral.

Signal to noise measurements in MR images for various configurations of the tablet. The tablet did not produce any detrimental effects during scanning.

Behavioral and imaging results for one participant undergoing the Trail Making Test using the fMRI-compatible drawing tablet. Both a) representative drawings and the corresponding b) fMRI activation maps are shown. Radiologic convention is employed (left hemisphere on the right). See text for full description of activated regions.

METHOD AND SYSTEM FOR COMPUTERIZED DRAWING AND WRITING DURING FUNCTIONAL MAGNETIC RESONANCE IMAGING

FIELD OF THE INVENTION

This invention relates generally to a method and system to record and visualize drawing and writing movements during functional magnetic resonance imaging (fMRI) of brain activity.

BACKGROUND OF THE INVENTION

Tablets and touch screens have long been developed and are widely used in society. Typically these devices facilitate user input in conjunction with computer systems. Many handheld devices, such as the personal digital assistant (PDA), incorporate touch screen technology as a means of user interaction. There currently exist many patents relating to the design, manufacture, and use of tablets or touch screens, and representative USPTO examples relating to the proposed invention are given below:

| U.S. Pat. No. | Inventor(s) | Title |
| --- | --- | --- |
| 5,938,163 | Gotham et al. | Articulating touchscreen interface |
| 5,956,020 | D'Amico et al. | Touchscreen controller with pen and/or finger inputs |
| 6,018,336 | Akiyama et al. | Computer system having digitizing tablet |
| 6,738,049 | Kiser et al. | Image based touchscreen device |
| 6,901,277 | Kaufman et al. | Methods for generating a lung report |
| 6,317,617 | Gilhuijs et al. | Method, computer program product, and system for the automated analysis of lesions in magnetic resonance, mammogram and ultrasound images |
| 6,204,201 | Xu et al. | Computerized detection of lung nodules using energy-subtracted soft-tissue and standard chest images |
| 6,234,979 | Merzenich | Computerized method and device for remediating exaggerated sensory response in an individual with an impaired sensory modality |
| 6,315,569 | Zaltman | Metaphor elicitation technique with physiological function monitoring |

U.S. Pat. No. 5,938,163 to Gotham describes an articulating system for mounting a touch screen (control console) onto a machine. A swiveling base on top of a sliding platform allows the console to be positioned in a plurality of positions within a 3D space. The purpose of said patent is to allow ergonomic access to the console regardless of where the user is positioned.

U.S. Pat. No. 5,956,020 to D'Amico describes the specifics of a touch screen controller for enabling operation of a touch sensitive screen in response to commands from an application program executing on a data processor that is electronically coupled to the controller. Input to the screen may be by pen or finger. Additional claims relate to the ability of the controller to take various actions, including resizing of the active area, dependent on the state of the host computer.

U.S. Pat. No. 6,018,336 to Akiyama describes use of a digitizing tablet to emulate computer mouse function. Event data, such as tapping motions, are added to the coordinate values x and y and sent to the tablet driver. These data are interpreted by a pointing management system that then further structures the information, prior to communication with the computer's operating system. In this manner the many functions of the mouse can be simulated, including drag-and-drop, and left/right clicks.

U.S. Pat. No. 6,738,049 to Kiser describes a customizable input device comprising a display device, a touch screen, and a microcontroller. Claimed as part of this patent is a system whereby images are displayed to a user prompting some form of response via the touch screen. Input from the touch screen is interpreted by the microcontroller before being sent to a computer system. The computer then alters the display accordingly. Further claims include the ability to overlay a transparent touch screen directly above the image surface. The device is connected to the computer via universal serial bus (USB).

A number of representative patents relate use of tablet and touch screen technology with analysis of diagnostic medical images. U.S. Pat. No. 6,901,277 to Kaufman describes the software, methods and user interfaces for viewing and generating a lung report. Information regarding lung nodules can be stored and used to relocate the previously localized lung nodules in a second, follow-up imaging scan. Scans can be analyzed manually or automatically and statistics are produced for reporting about localized lung nodules based on changes between initial and follow-up scans. The images can come from various imaging modalities such as MRI or CT. Users interact with the system via various input peripherals.

Similarly, U.S. Pat. No. 6,317,617 to Gilhuijs describes a method and system for the computerized automatic analysis of lesions in magnetic resonance (MR) images, a computer programmed to implement the method, and a data structure for storing required parameters. Specifically, the system offers the ability to conduct computerized analysis of lesions in the breast using spatial, temporal and/or hybrid measures. The system also allows for the enhanced visualization of the breast and its pathological states. The system also includes an option to merge the extracted features with those from x-ray and/or ultrasound images to further characterize the lesion and/or make a diagnosis. Other imaging techniques, such as CT and/or MRI can also be employed.

U.S. Pat. No. 6,240,201 to Xu describes a method, system, and computer-readable medium configured for computerized detection of lung abnormalities. This includes the acquisition of various images of the chest and identifying abnormalities through a series of analyses, such as difference maps. As mentioned in the Kaufman and Gilhuijs patents, the images may be obtained using different imaging modalities. Control of the system is achieved using input devices, such as keyboards, mice, and/or computerized tablets.

Other prior art relates to use of tablets and touch screens for functional monitoring. U.S. Pat. No. 6,315,569 to Zaltman describes a process and apparatus for using a metaphor elicitation technique in conjunction with physiological function monitoring to elicit, organize and analyze data pertaining to a research topic. The metaphor elicitation technique process and apparatus is improved with the acquisition of data related to a user's physiological functioning. This data provides further insight and understanding which can be used in creating an appropriate marketing campaign for a product, improving inter-office communications and determining the presence of pre-existing biases or beliefs. Physiological monitoring may include functional magnetic resonance imaging, positron emission tomography, galvanic skin response or conductance, event related potentials, or heart rate changes. The technique involves a series of specific tasks, one of which, the Mental Map, involves image validation and creation using a mouse, cursor, or pressure sensitive digitizing tablet (via a stylus or a finger).

U.S. Pat. No. 6,234,979 to Merzenich outlines a method of using an apparatus for implementing a training regime having a stimulator and an input device, for remediating exaggerated responses associated with a super-group of neurons in an individual with an associated impaired modality. Many modifications to the method are mentioned, for example, the invention can be practiced with or without feedback. Furthermore this feedback may be manual or automated. Manual feedback can provide an indication that an input is causing discomfort or pain, or the individual is able to distinguish the stimuli. Examples of automated feedback include brain imaging such as MEG and fMRI to monitor changes and responses within the super-group of neurons. Different types of input devices, such as a computerized tablet, can be used to input commands and other instructions into the computer system, which serves as the backbone of the invention.

Though tablet devices have achieved considerable popularity and commercial success, there has been continuing demand to expand on their use and application. One such application is in the field of functional neuroimaging, which involves the measurement of brain activity associated with human behavior. Techniques such as functional magnetic resonance imaging (fMRI) allow researchers and clinicians to visualize regions of brain activity with high spatial resolutions (millimeters), in accordance to the tasks being performed by the subject inside the scanner.

Functional neuroimaging is a broad field encompassing a variety of medically-oriented applications, including use in neurosurgical planning, potential detection of neurodegenerative disease, and monitoring the response of neural tissue to targeted therapeutic interventions such as pharmacotherapy, stem cell therapy, cognitive rehabilitation, or physical rehabilitation. In their idealized forms none of the previously mentioned patents focus on augmenting functional neuroimaging through use of tablet devices for such applications.

Specifically, certain publications such as U.S. Pat. No. 6,901,277 to Kaufman, U.S. Pat. No. 6,317,617 to Gilhuijs and U.S. Pat. No. 6,240,201 to Xu, describe use of imaging technologies such as CT and MRI to acquire anatomical images of the body and describe various means to manipulate and analyze the data. Interaction with their respective systems is proposed through use of input peripherals, such as a mice, keyboards, and/or computerized tablets. These devices would typically be used by the CT or MRI technologist during image acquisition or by a radiologist during image interpretation. The proposed invention differs significantly from these previous works in its design and application, has been engineered primarily to operate within the bore of an MRI scanner, and is for use by the individual being scanned during functional neuroimaging, or more specifically functional magnetic resonance imaging (fMRI) of brain activity.

U.S. Pat. No. 6,315,569 (Zaltman) and U.S. Pat. No. 6,234,979 (Merzenich) concern techniques for probing and rehabilitating response to stimuli. The invention disclosed in U.S. Pat. No. 6,315,569 describes a procedure for evaluating responses to marketing material, whereas, U.S. Pat. No. 6,234,979 describes a training regime to alleviate exaggerated response to sensory stimuli (e.g. hypersensitivity to sound in autistic children). Both mention the use of adjunct physiological measurements such as PET and fMRI as feedback mechanisms and the use of input devices for interaction with a computer system. However, the merger of the two disparate ideas is neither discussed nor elaborated in any detail. Instead the peripherals are discussed in the context of a means for generic user input outside of a MR scanner environment. As mentioned above the present invention details a system specific for drawing and writing inside the MR scanner environment specifically to augment fMRI capabilities.

Functional MRI is a relatively new technology that relies on neurovascular coupling and hyperemia effects. Sensitive to small percentage changes in the flow, volume, and oxygenation of blood that occur over short time spans in the local vicinity of neurons that have become more electrically active in comparison to baseline levels, fMRI makes it possible to identify spatiotemporal patterns of activation in various regions of the brain associated with specific tasks, typically on the second and millimeter time and spatial scales, respectively.

Considering a combinations of factors such as cost, availability, risk and invasiveness, sensitivity, spatial and temporal resolution, and volume of coverage within the brain, fMRI has numerous advantages over other functional neuroimaging modalities. However, there are some technical challenges associated with this technology. For example, fMRI is typically conducted in a very strong static magnetic field (>1 Tesla), with accompanying weaker but dynamic spatially varying magnetic fields (~10 mT/m gradients and ~100 T/m/µs slew rates), and with stringent constraints regarding radiofrequency electromagnetic interference (EMI) from other nearby electronic devices. Therefore, electronic equipment designed for use within the scanner must adhere to these strong electromagnetic restrictions.

Functional MRI is also very sensitive to head motion. Very subtle head motion on the order of millimeters can significantly degrade image quality. As well, the behavioral tasks and analytic approaches that are adopted in fMRI studies greatly influence the resulting images of brain activity. Much work has already gone into the development of fMRI-compatible devices including MRI-compatible display systems, response pads, joysticks, and audio equipment. However, to date, no device has been manufactured or patented that would capture and display drawing movements within the scanner. This invention addresses this deficit through the design of the fMRI-compatible drawing tablet.

There is strong motivation to permit and record writing and drawing movements during fMRI. For example, the ability to record and display subject responses using a pen-like interface would allow traditional neuropsychological assessments to be performed inside the scanner. There are hundreds of neuropsychological tests for probing the various aspects of cognitive function, such as attention, memory, executive function, language, and general cognitive ability. The majority of these tests are pen-and-paper based in that the clinician or neuropsychologist presents the subject with a set of instructions and the subject reacts by writing or drawing their response on paper.

Examples of traditional pen-and-paper tests include the Rey-Osterrieth Complex Figure [(Rey, A., The psychological examination of cases of traumatic encephalopathy. *Archives de Psychologie,* 37:126-139, 1941) & (Osterrieth, P. A., Copying a complex figure: Contributions to the study of perception and memory. *Archives de Psychologie,* 30:203-353, 1944)], the Trail Making Test [Lezak et al., *Neuropsychological assessment,* 4$^{th}$ *Edition*. New York: Oxford University Press, 2004], the Clock Drawing Test [Sunderland, T. et al., Clock drawing in Alzheimer's disease. A novel measure of dementia severity. *J Am Gedatr Soc,* 37:725-9, 1989], various letter and symbol cancellation tasks, the Benton Visual Retention Test [Benton, A. L., *The Revised Visual Retention Test: Clinical and Experimental Applications*. New York: Psychological Corp, 1963] and the Goodenough-Harris Drawing Test [Harris, D. B., *The Goodenough-Harris drawing test.*

Los Angeles: Harcourt-Jovanovich, 1963]. Each test is designed to probe a particular aspect of cognitive function and their utility in the clinic has been proven through rigorous research and clinical trials. However, the exact neurological underpinnings of these tests are often unknown or are based on lesion studies, which have their own inherent confounds.

It would be of great benefit to researchers and clinicians if these tests could be performed together with fMRI to identify the brain regions that are engaged. Knowing the areas of the brain implicated in such tests is critical for clinical application of the test and is especially important during planning of rehabilitation strategy or pharmacological intervention. To conduct these studies it is important that the tests be reproduced during fMRI in a manner similar to their administration in the clinic.

Similar to the neuropsychological tests mentioned above there are a multitude of personality tests and scales that require written responses. Some examples include the Montgomery-Asberg Depression Rating Scale (MADRS) [Montgomery, S. A., & Asberg, M., A new depression scale designed to be sensitive to change. *Br J Psychiatry*, 34:382-389, 1979], the Brief Psychiatric Rating Scale (BPRS) [Overall, J. E., & Gorham, D. R., The Brief Psychiatric Rating Scale. *Psychological Report*, 10:799-812, 1962], and the Self-Control Rating Scale [Kendall, P., & Wilcox, L., Self-control in children: Development of a rating scale. *Journal of Consulting and Clinical Psychology*, 47:1020-1029, 1979]. These measures are also largely understood in terms of their underlying functional networks so investigation with fMRI would be highly valued.

Besides investigation of neuropsychological tests and scales one domain of particular scientific interest is general drawing and copying behaviour. As such there are several published scientific papers that have examined the neural correlates of drawing and/or copying during functional neuroimaging. Most relevant are papers by Katanoda et al. [Katanoda et al., A functional MRI study on the neural substrates for writing. *Hum Brain Mapp*, 13(1): 34-42, 2001] and Makuuchi et al. [Makuuchi et al., Both parietal lobes are involved in drawing: a functional MRI study and implications for constructional apraxia. *Cogn Brain Res*, 16(3): 338-47, 2003]. Both studies help to provide additional knowledge critical in the treatment of brain-damaged patients incapable of performing drawing or copying tasks. A particular condition causing such a deficit is called constructional apraxia, and refers to the inability of patients to assemble the elements of a model object in their correct spatial relationships.

Further fMRI investigation into the exact neurological underpinnings of this condition is underway. However, to do so, the task should be executed in a manner similar to real life. Both studies described immediately above involved writing/drawing with the right index finger, either in the air or on a fixed surface, during fMRI. Such a configuration is very unlike how people write in everyday life and therefore the generalizability of the reported findings is questionable. Furthermore, without a method to capture user input (ie. what the user "writes") it becomes difficult to assess the behavioral performance that underlies the resulting images of brain activity. An fMRI-compatible tablet system would help to overcome these limitations.

Additional studies have examined the task of writing/drawing with other functional brain mapping techniques. Examples include Bhattacharya et al., who in their 2005 paper [Bhattacharya et al., Drawing on mind's canvas: Differences in cortical integration patterns between artists and non-artists. *Hum Brain Mapp*, 26(1): 1-14, 2005] compared multi-channel electroencephalograph (EEG) signals in groups of artists and non-artists. The results of this study demonstrated that in artists, patterns of functional cooperation between cortical regions during mental creation of drawings were significantly different from those in non-artists. This study did not use any sort of drawing device, only mental imagery, but further demonstrates the level of interest in this particular field of neuroscience.

Another study [Siebner et al., Brain correlates of fast and slow handwriting in humans: a PET-performance correlation analysis. *Eur J Neurosci*. 14(4): 726-36, 2001] employed $H_2^{15}O$ positron emission tomography (PET) to measure the regional cerebral blood flow (rCBF) in 10 healthy subjects during handwriting. This particular study used standard pen-based recording, with and without feedback, to examine the cerebral control of velocity during handwriting. Because it was not limited by the confines and constraints of fMRI, use of a traditional writing tool was possible. However, PET is generally acknowledged to exhibit lower spatial and temporal resolution than fMRI, and additionally requires the administration of radiopharmaceuticals. The study concluded that there exists a set of regions particularly involved in the processing of slow closed-loop writing movements (i.e. without feedback and half of normal writing speed). These regions included the right lateral premotor cortex, the left anterior parietal cortex, the left anterior putamen, the left rostral supplementary motor area and the right precuneus.

Other relevant scientific work appeared as an abstract at the Annual Meeting of the Organization for Human Brain Mapping in 2004. [Reithler et al., Resistance-based Recording of Pen Trajectories in an fMRI setting, *Hum Brain Mapp*, Abst. #320, 2004]. The authors describe a system for capturing pen movements during fMRI using a resistive touch surface. However, the device operates very differently from the invention presented here. First, a single value is output from the device, enabling only a 1-dimensional measurement of movement. Therefore, the paths that users are asked to trace must be known a priori. Second, the basic working principle of the device is that the pen and path surface form an electrical circuit that exhibits resistance changes as the pen is moved around the drawing surface. Third, no visual feedback of performance is provided; captured drawing movements are not visible to the user. Although useful in some applications, this device is more limited in its ability to enable and record realistic copying and drawing behaviour than the present invention.

Beyond neuropsychological assessment and basic scientific investigations into drawing and copying, the fMRI-compatible tablet would also be useful for exploring writing rehabilitation strategies. The physiology of acquired disorders of writing and mechanisms for their recovery are largely unknown. These disorders are common in stroke patients who often suffer some form paresis in their limbs (hand) as a result of the stroke.

There has been a great deal of research exploring post-stroke of motor function; however few have directly investigated the task of writing. One exception is a paper by Papathanassiou et al, titled "Plasticity of motor cortex excitability induced by rehabilitation therapy for writing", in which the authors study the brain's ability to reorganize neural pathways (i.e. plasticity) during a rehabilitative writing therapy. Using transcranial magnetic stimulation (TMS) and an electroencephalogram (EEG) the authors discovered that rehabilitation aimed to increase the use of the paretic hand during writing may induce recruitment of previously silent neural pathways even in poorly recovered post-stroke patients. This is a considerable finding and illustrates the importance of employing such strategies during a rehabilitation program.

With this in mind, further research into which writing regimes are most beneficial and to what degree they are able to reorganize the brain must be pursued. Functional MRI would be the favoured technology to conduct these studies due to its excellent spatial resolution and imaging characteristics, but an fMRI-compatible writing tablet requires development.

U.S. Pat. No. 6,234,979 to Merzenich discusses a remediation technique for individuals with an impaired sensory modality but is unspecific to the task of writing. Furthermore, brain imaging is limited to use as a feedback mechanism during their intervention and not as a means to investigate neuronal plasticity and reorganization in the brain.

Use of the fMRI-compatible tablet extends beyond established neuropsychological assessment and rehabilitation techniques and provides increased flexibility for designing new behavioural tasks. For example, the device could be used as a generic input peripheral, similar to a mouse or keyboard but specific for use within the MRI bore during fMRI. This is important because much of fMRI usage involves (but is also limited by) use of fMRI-compatible "response boxes" that enable the user to respond by pressing a button. Such response boxes are sufficient for simple user input, for example choosing one response by button press from a small list based on some previously presented stimuli. However, these devices typically only offer one button press per finger, for several fingers. Increasing the complexity of such devices (e.g. more buttons) becomes a "response mapping" problem requiring potentially significant training time for individuals to become comfortable learning to make selections with a non-intuitive interface.

Furthermore, currently there is no simple way for the user to provide a response at a specific x-y position during fMRI, especially to the precision and accuracy achievable with a mouse or tablet. Several fMRI-compatible joysticks are available but these require buttons for response selection. Mice have their own inherent limitations because they require a smooth, flat surface for operation and thus are ill-suited to the confines of an MR bore. A computerized tablet replicates much of the functionality of a mouse but offers a more intuitive interface, especially in the context of fMRI. This functionality enables manipulation of various graphical user interface elements such as check boxes, scroll bars, radio boxes, dials and buttons as necessary to develop new assessments of human behaviour.

Existing patents and scientific publications relating to tablet technology do not encompass the functionality of the fMRI-compatible tablet. Use of a resistive sensor, as proposed by Reithler et al. in their 2004 publication, limits researchers to a small subset of experiments and does not allow for natural capture of handwriting or drawing during fMRI. Re-emphasizing, it would be very advantageous to provide a device to record and visualize drawing and writing movements during fMRI that would allow individuals lying inside the scanner to interact with the device in a natural, intuitive way, similar to writing with pen and paper, and that would significantly augment current fMRI applications. The invention described here fulfills this need by allowing drawing movements to be captured and recorded during fMRI with optional visual feedback relayed to the user.

SUMMARY OF THE INVENTION

Considered broadly, tablets and touch screens serve as a means of user input into a computerized device, similar to a keyboard or mouse. Their main purpose is to simulate handwriting or drawing operation, allowing for a more intuitive form of interaction with the computer. Many devices employ such technologies due to their inherent ease of use. Distinct from this is functional magnetic resonance imaging (fMRI), a technique used to non-invasively map regional brain activity associated with specific behaviours. Of particular interest to fMRI researchers are areas of the brain implicated during drawing and writing; tasks which are very prevalent in everyday life. Also of interest is the ability to conduct additional behavioral assessments during fMRI that are naturally based on drawing and writing capabilities, such as many neuropsychological assessments. For such applications, a device is required that can perform the functions of a standard computer tablet with the added constraints of fMRI, namely the ability to operate a) within a large static magnetic field (in the Tesla range), b) within dynamic magnetic fields (with fluctuations in the 100 T/$\mu$s range), and c) with no EMI that significantly degrades fMRI data quality. The present invention meets these requirements.

Thus, the present invention provides a system for computerized drawing and writing during functional magnetic resonance imaging (fMRI) of a user's brain by an MRI scanner located in an electromagnetically shielded enclosure for mapping the user's brain activity during a behavioral task, comprising:

a) an fMRI-compatible touch-sensitive tablet having a touch-sensitive surface configured to detect user input while the user is subject to functional magnetic resonance imaging (fMRI);

b) an fMRI-compatible tablet support mounted on a patient table, said touch-sensitive tablet being mounted on said tablet support, said tablet support including means for adjusting said tablet support and for ergonomically accessing the touch-sensitive tablet by the user;

c) an fMRI-compatible visual display mechanism for displaying to the user an input made by the user on the touch-sensitive tablet; and d) a microprocessor controller connected to said visual display mechanism and said touch-sensitive tablet, said microprocessor controller being located outside the electromagnetically shielded enclosure, said microprocessor controller including processing means for converting the user's input to said touch-sensitive tablet into visual stimuli displayed on said visual display mechanism, logging the input into temporal and two dimensional spatial coordinates, and interpreting the input associated with the behavioral ask under fMRI investigation.

In an embodiment of the invention the equipment residing inside the magnet room may be non-ferromagnetic and does not interfere with scanner operation. Individuals (patients or healthy volunteers) lying inside the scanner bore interact with device in a natural, intuitive way, similar to writing with pen and paper. Drawing motions captured by the tablet are displayed either through a pair of MR-compatible goggles (in addition to any other visual stimuli that are presented to the subject for the purpose of assessing specific aspects of human behavior), or using a projector and projection screen combination. The method and system disclosed herein allows for a plurality of experiments to be performed, all while brain activity is measured and recorded.

The present invention provides a method for computerized drawing and writing during functional magnetic resonance imaging (fMRI) of a user's brain by an MRI scanner located in an electromagnetically shielded enclosure for mapping the user's brain activity during a behavioral task, comprising:

a) placing a user on a patient table and inserting the user into a bore of the MRI scanner, the patient table including an fMRI-compatible touch-sensitive tablet configured to detect user input while the user is subject to functional magnetic resonance imaging (fMRI), the touch-sensitive tablet being mounted on a tablet support, the tablet support including means for adjusting said tablet support and for ergonomically accessing the touch-sensitive tablet by the user;

b) during functional magnetic resonance imaging (fMRI) the user interacting with the touch-sensitive tablet for entering input thereto;

c) displaying to the user the input entered by the user on the touch sensitive tablet;

d) converting the user input to the touch-sensitive tablet into visual stimuli displayed on a visual display mechanism, e) logging the input into temporal and two dimensional spatial coordinates, and f) interpreting the input associated with the behavioral task under fMRI investigation.

BRIEF DESCRIPTION OF THE DRAWINGS

Preferred embodiments of the invention will now be described, by way of example only, with reference to the drawings, in which.

DETAILED DESCRIPTION OF THE INVENTION

Generally speaking, the systems described herein are directed to devices to record and visualize drawing and writing movements during functional magnetic resonance imaging (fMRI) of brain activity. As required, embodiments of the present invention are disclosed herein. However, the disclosed embodiments are merely exemplary, and it should be understood that the invention may be embodied in many various and alternative forms. The Figures are not to scale and some features may be exaggerated or minimized to show details of particular elements while related elements may have been eliminated to prevent obscuring novel aspects. Therefore, specific structural and functional details disclosed herein are not to be interpreted as limiting but merely as a basis for the claims and as a representative basis for teaching one skilled in the art to employ variously the present invention. For purposes of teaching and not limitation, the illustrated embodiments are directed to embodiments of devices to record and visualize drawing and writing movements during functional magnetic resonance imaging (fMRI) of brain activity.

As used herein, the term "about", when used in conjunction with ranges of dimensions, temperatures or other physical properties or characteristics is meant to cover slight variations that may exist in the upper and lower limits of the ranges of dimensions so as to not exclude embodiments where on average most of the dimensions are satisfied but where statistically dimensions may exist outside this region. For example, in embodiments of the present invention some dimensions are given which are exemplary but may be different than these dimensions. It is not the intention to exclude embodiments such as these from the present invention.

As used herein the phrase fMRI-compatible refers to devices that are intended for use during fMRI procedures such that neither the data recorded by the device nor the data recorded by the fMRI procedure are reasonably considered as detrimentally affected by the joint usage. The phrase MRI-compatible is defined analogously and in the context of this application refers to use of devices in combination with all other MRI procedures, such as anatomical MRI and angiographic MRI. An MRI-compatible device does not guarantee fMRI-compatibility. Examples of methods to make devices fMRI-compatible include but are not limited to use of non-ferromagnetic materials, such as plastic, to eliminate attractive forces between the device and the superconducting magnet of the MRI scanner, and specialized shielded electrical cables to eliminate electromagnetic interference that could corrupt the data measured by the device and corrupt the signal-to-noise ratio or contrast-to-noise ratio of the fMRI data.

Figure 1:
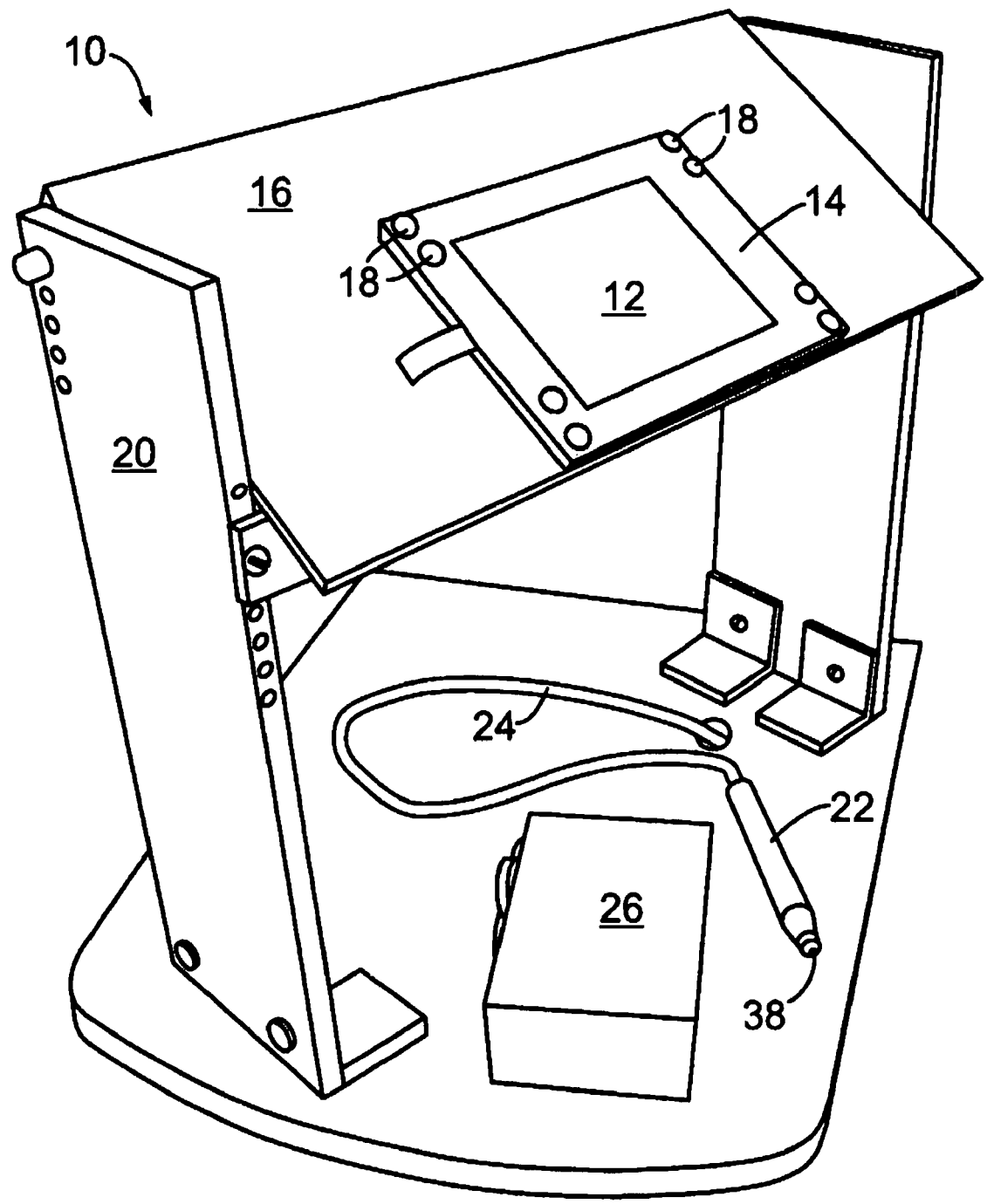
FIG. 1 is a photograph of the fMRI-compatible tablet with some parts removed for clarity of illustration and in which the key components (numbered) are described in the following section.

An embodiment the fMRI-compatible tablet shown generally at 10 in FIG. 1 and unlabelled but obviously implied in subsequent Figures thereafter includes several components. A touch sensitive tablet 12 with a screen surface uses specialized technology to translate a touch into electrical signals. The design used a 6.4" by 6.4" polyester laminate (PL) resistive 4-wire touch screen (Microtouch™, Model #RES-6.4-PL4, 3M Inc.) for this purpose. This screen was chosen for several reasons: a) the PL material is non-ferromagnetic and easily attached to shielded and filtered cabling to ensure fMRI-compatibility; b) accuracy and report rate (0.005 inches and a default of 180 reports/sec, respectively) as measured for the functioning prototype exceeded performance criteria, c) use with an fMRI-compatible stylus is supported, as well as any form of reasonable touching achieved by movement of a body part; d) ready availability and ease of assembly and system integration; and e) affordable (less than $100 US for the touch screen and USB touch screen controller). Numerous other touch screen technologies are available, such as capacitive or infrared system, and could be rendered fMRI-compatible. Notably, however, none at present have the combination of attractive features indicated above.

The touch screen 12 is mounted into a plastic holder 14 to prevent damage to the sensitive surface. The holder 14 and touch screen 12 attach onto a plastic tablet frame 16 using a series of plastic screws 18. The position of the plastic holder 14 on tablet frame 16 can be modified by using a different set of mounting holes located in the tablet frame 16. The top surface of the tablet frame 16 is attached to two support legs 20 that sit on the sides of the patient table (see FIG. 4). In certain applications these legs 20 can be firmly affixed to the patient table using a set of specially designed table clamps (not shown). The top surface of the tablet frame 16, with screen 13 attached, can be adjusted in various different ways to accommodate the user who lies underneath. For example the angle of the tablet frame 16 can be changed from 35 degrees to 90 degrees (i.e. perpendicular to the user's body). In addition, the overall height of the device can be changed from 20 cm to 40 cm above the table surface on which the patient is lying. Limiting these adjustments for writing and drawing are the confines of the magnet bore, which for typical MRI systems range from 55 to 60 cm in diameter. However, other configurations of the touch screen and stylus are possible that are not limited by bore diameter.

In practice, interaction with the touch screen can be achieved with almost any appendage that can be moved into contact with the screen surface (for example, the knee or the foot, in cases where the upper limbs are paralyzed or encumbered by other fMRI-compatible devices). In such cases, contact with the device could be optimized through use of wearable fMRI-compatible apparel with a protruding point of contact.

Figure 2:
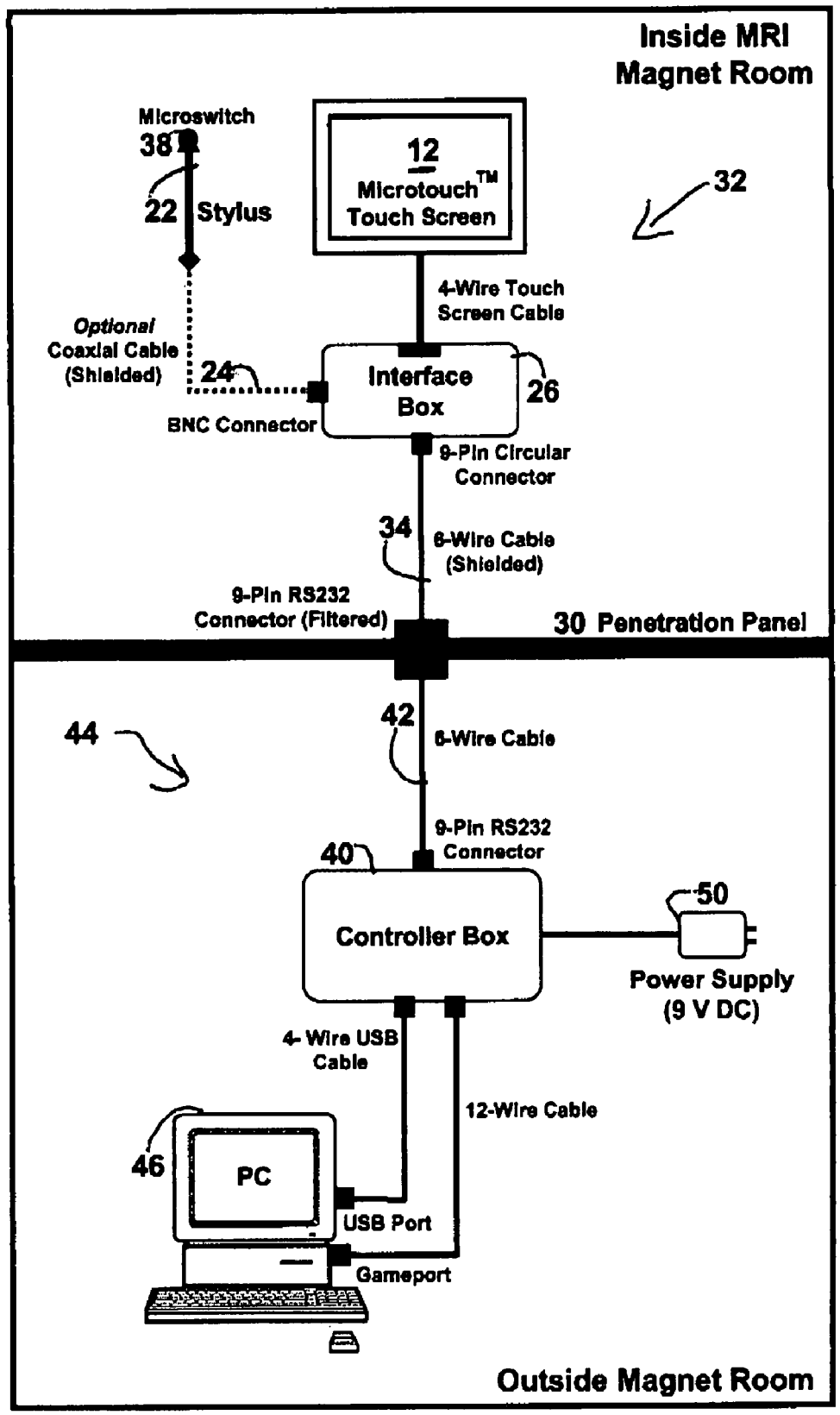
FIG. 2 is a block diagram depicting the various components and their respective connections.
Figure 3:
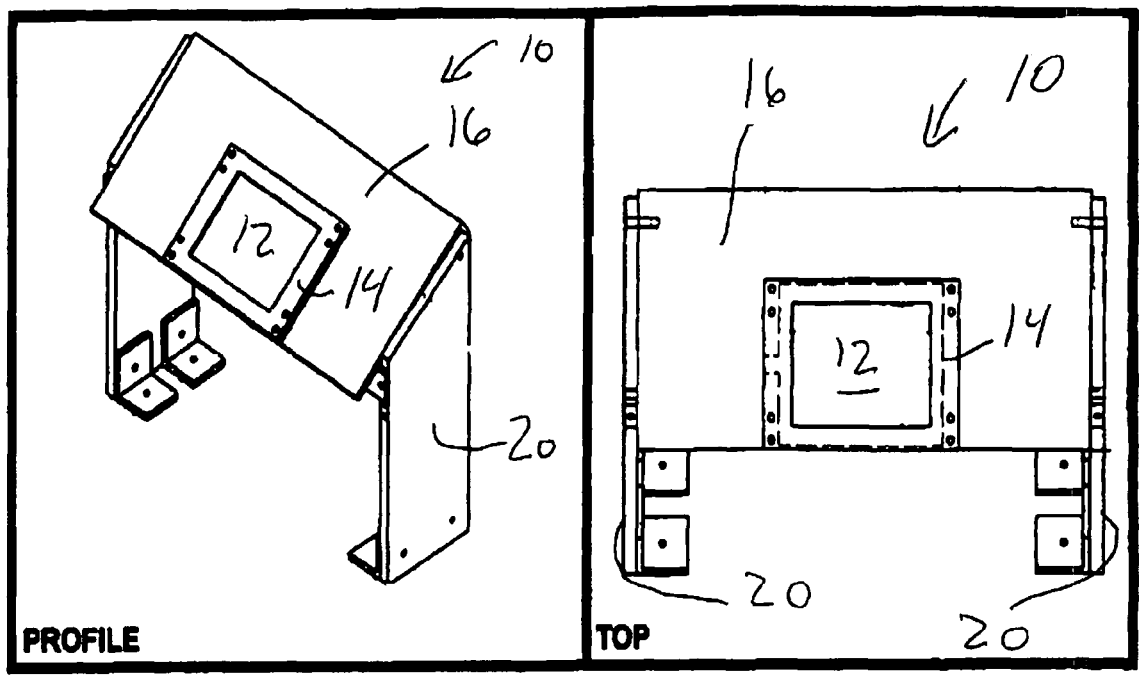
FIG. 3 contains front (left pane) and side (right pane) elevational views of the device with dimensions.

As shown in FIG. 2, attached to the underside of the table frame 16 is an interface box 26 that connects a stylus 22 to a shielded cable 24 (Type 9539, Belden Inc.) running to the penetration panel 30 of the magnet room. The penetration panel 30 is standard in MRI systems and is the main conduit for passing electrical signals from inside the magnet room 32 through the radiofrequency shield to the associated equipment room or operator console area. The penetration panel 30 itself is electrically grounded and contains filter components to prevent unwanted electromagnetic signals of specific frequencies from entering the magnet room and corrupting image data. A cable 34 connects to the interface box 26 via a 9 pin circular connector (LEMO Inc.) and terminates at the penetration panel 30 with a 9-pin RS232 type connector. The interface box 26 is connected to a controller box 40 located in the outside MRI suite 44 by a cable 42 which connects to cable 34 at penetration panel 30. It will be appreciated by those skilled in the art that instead of shielded wire connections, the device may employ fMRI-compatible wireless technology (WIFI, Bluetooth, etc.) or optoelectronics for connectivity between the tablet 12 and the controller box 40.

The fMRI-compatible interface 26 may be configured to convert electrical signals received from said fMRI-compatible touch-sensitive tablet into optical signals, in which case an optical fiber may be used to connect the fMRI-compatible interface 26 to an optoelectronic stage located outside of the magnet room incorporated within said microprocessor controller 46.

The stylus 22 is preferably made from acrylic and is roughly 14 cm in length. Optionally contained in the tip of the stylus 22 is a microswitch 38 that detects contact between the stylus 22 and the surface of touch screen surface 12. The purpose of the microswitch 38 is described in the software section below. When the microswitch is included the stylus 22 is connected to the interface box 26 with 50 cm length of the shielded cable 24 (dotted line in FIG. 2).

Components 12, 14, 16, 18, 20, 22, and 38 are non-ferromagnetic and are designed for use inside the MRI suite 32. Outside the magnet room 32 are connectors linked to the penetration panel 30. A similar 9-pin RS232 connector plugs into the port corresponding to the connector used inside the magnet room 32. This links to the controller box 40. The controller box 40 contains the electronic logic for the tablet 12. In the system disclosed herein a SC400 Microtouch™ controller (3M Inc.) is used, however similar controllers from other vendors could easily be substituted. The controller box 40 connects to computer or microprocessor 46 using USB connection for transmitting data from the tablet controller 40 and a 12-pin connector for transmitting the state of the stylus (contact or no contact). This 12-pin connector plugs into the gameport of a personal computer (PC) 46, which recognizes the stylus 22 as a simple 2-button joystick/gamepad. The controller box 40 is also powered with a 9V DC power supply 50. All cables and connectors are represented in FIG. 2.

Software on the microprocessor or PC 46 interprets the signals and displays the subsequent actions back to the user via a visual display mechanism such as but not limited to a pair of fMRI-compatible goggles (SV4021, Avotec Inc.) or by back-projecting images on a screen, viewable through a mirror mounted on the head coil within the scanner bore.

Particularly, the microprocessor controller 46 is connected to a visual display mechanism and the touch sensitive tablet 12, the microprocessor controller is programmed for converting responses of the user input to the touch sensitive tablet 12 into visual stimuli displayed on the visual display mechanism, logging the responses into temporal and 2 dimensional spatial coordinates, and interpreting the responses associated with the behavior task under imaging fMRI investigation.

Typically, actions would be in the form of cursor movements whereby movement on the tablet surface is inferred by the computer, similar to that of mouse or trackball. Such actions can be used in a variety of applications. One example is a decision making task in which users must make selections according to visual or auditory stimuli. Another task would investigate the mechanisms of drawing and copying by having users draw objects of recognizable or non-recognizable (nonsense) form. These examples are non-limiting and the complete set of uses of the fMRI-compatible tablet will be known to those skilled in the art.

The initial software package developed for the tablet allows for experimental stimuli, such as text or images, to be presented to the user and prompts for a response via the tablet and stylus. The sensory stimuli may be any one or combination of visual, auditory, or tactile.

The presence of the microswitch at the stylus tip, although non-essential, improves usability given that under most circumstances the user is positioned supine within the MRI system such that they are unable to view their own writing and drawing motions directly. A crosshair on the screen reflects the position on the tablet 12 when the user moves the stylus lightly, activating the touch screen but not the microswitch. To draw, the user must press down with the stylus 22 with a similar force to that of writing with a pen or pencil, sufficient to activate both the touch screen and the microswith simultaneously. This condition is recognized at the software level to change the cursor and a corresponding line is drawn on the screen. Without the switch 38 and the cursor functionality it would be slightly more difficult for the user to determine where on the drawing surface of tablet 12 the stylus 22 currently is positioned. Data from the tablet 12 and stylus 22 are sampled at 180 Hz, ensuring smooth capture of all drawing movements.

Beyond controlling the experimental stimuli and general behaviour of the device (i.e. tracking and displaying the stylus tip position) the software has numerous other functions. These include the ability to record, store, analyze and provide video playback of drawing movements produced by the user. The software records movement data and, along with an appropriate timestamp, logs it to a file. Separate functionality then loads this file to generate statistics regarding when and where the subject made drawing/writing movements.

Also, in accordance to the previously presented fMRI stimuli, the software replays the movements for visual inspection by the administrator or as feedback to the user. This information may be useful during fMRI data analysis because it identifies periods of time when the user was performing drawing movements, or, as another example, when the user was producing correct and incorrect responses. The software also has the ability to trigger the scanner so that the onset of scanning is synchronized with the time of behavioral tasks and responses. General functions of the software include the ability to alter the writing/drawing behaviour as observed by the user. For example, colors, cursor styles, or line widths can be changed, a mirror drawing option can be enabled (movements appear as the opposite to real-life actions), or a lag can be introduced. Such options may be useful during the implementation of an fMRI experiment (i.e. a comparison between standard and mirror drawing during rehabilitation of stroke patients).

Figure 4:
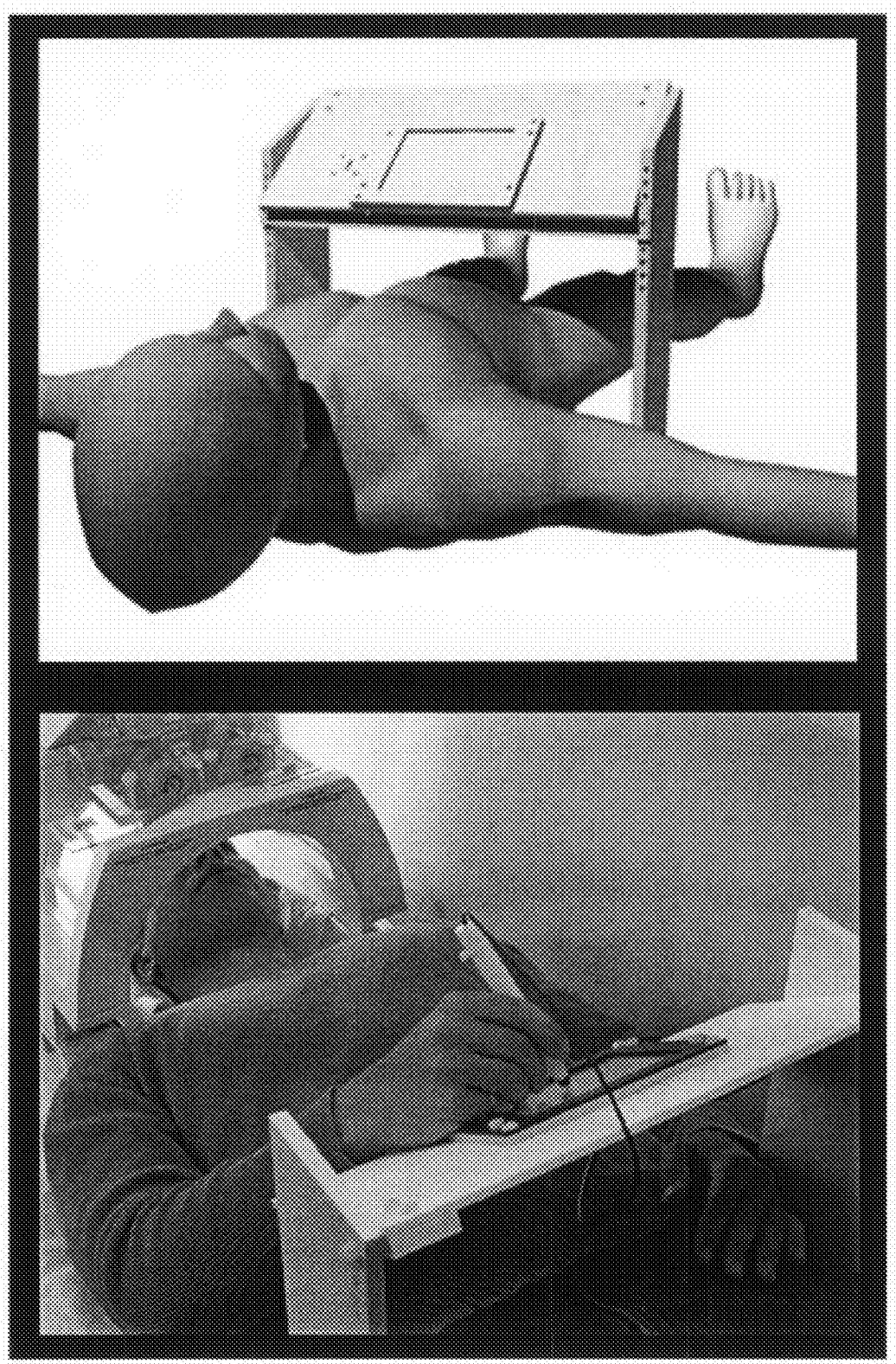
FIG. 4 contains a schematic and a photograph of the fMRI-compatible tablet with the preferred configuration above the subject's torso inside the magnet bore.

The system disclosed herein has been designed with consideration of the sensitivity of fMRI signals to head motion. Head motion is undesired because it has negative effects on the fMR images, which may be blurred or corrupted beyond use, even for displacements as small as one millimeter. Subjects lie in a supine position beneath the tablet with the tablet 12 elevated over their torso as shown in FIG. 4.

The tablet 12 is constructed on an articulating frame formed by legs 20 and tablet frame 16 so that it can be easily adjusted to accommodate subjects of varying size. The design of the tablet 12 allows for the tablet surface to angle and move vertically up and down. This enables a comfortable writing position. By elevating the tablet 12 above the torso, rather than resting upon it, respiratory movements do not interfere with the task of writing. Other ergonomic configurations are possible. Further mounting hardware would allow the tablet 12 to be placed on either side of the subject for writing with their dominant or non-dominant hand; depending on the specifics of the fMRI experiment. In this configuration, users would have their arms extended and would not be encumbered by the full support frame. A third mounting option actually places the fMRI-compatible tablet 12 within the wall of the MR scanner bore on an articulating frame. The advantages of such a setup are the ability to conceal the cabling and connectors associated with the device, and integration of the device with the surrounding MRI scanner hardware.

To reduce the amount of induced head motion while using the tablet (caused by translational movement from the arm to the head), users would typically have their upper arms padded or restrained. Based on the nature of the user and their ability to control hand and arm function accurately, a training regime can be adopted for users who have difficulty keeping their head still.

Figure 5:
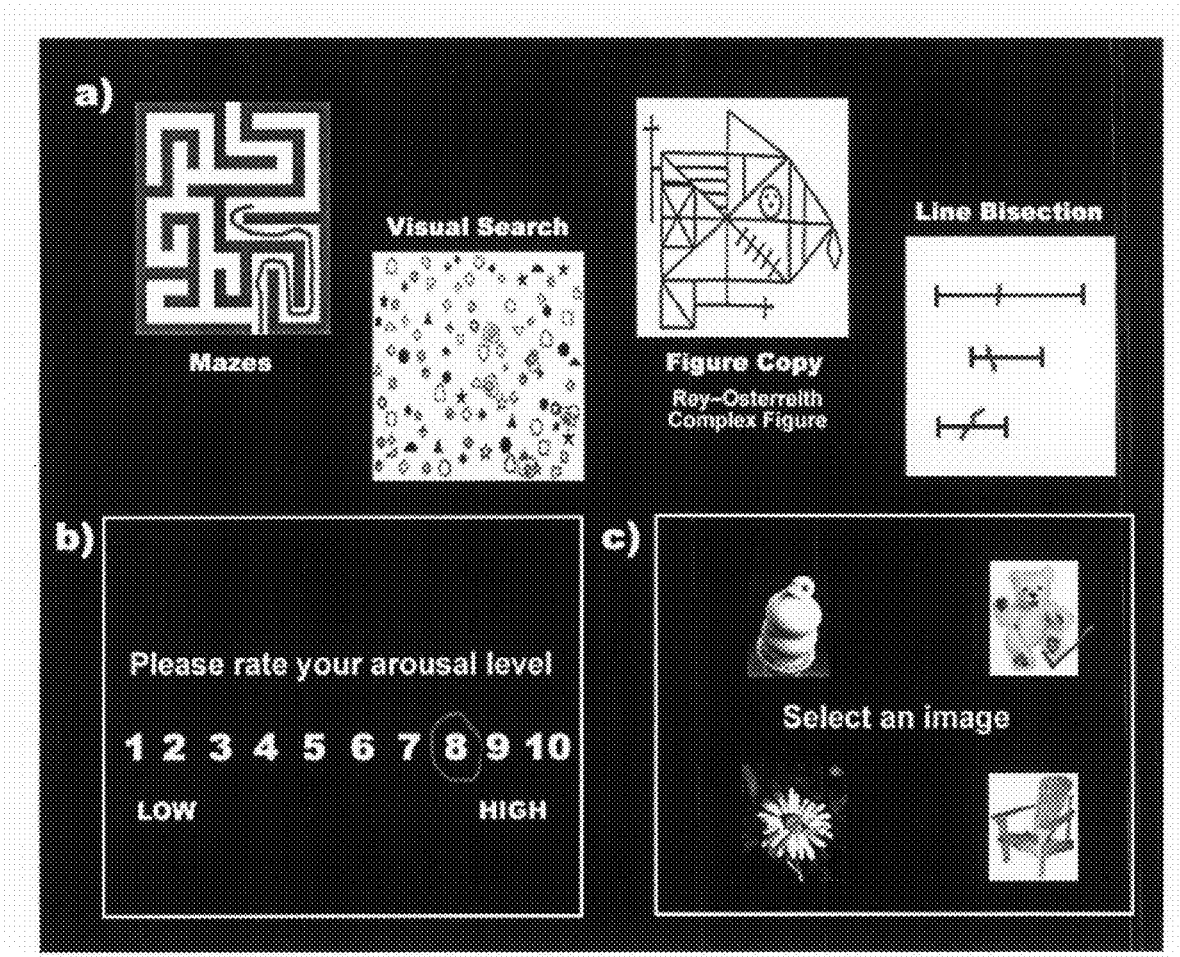
FIG. 5 illustrates some potential uses for the fMRI-compatible drawing tablet. These include use in traditional neuropsychological tests, rating scales, and more generally, as a user input device for fMRI experiments.

The fMRI-compatible drawing tablet can be used in a variety of ways, some of which are presented in FIG. 5. These include the ability to perform many traditional neuropsychological assessments, such as mazes, visual searches, and figure copying, during fMRI. Essentially, all pen-and-paper tests that are typically performed during clinical assessments by medical professionals (e.g. behavioural neurologist, clinical psychologist, psychiatrist, rehabilitation therapist, occupational therapist) can now be replicated, and more importantly, adapted to fMRI examinations.

The tablet also offers a more general use as an input peripheral, allowing manipulation of various graphical user interface elements such as check boxes, scroll bars, radio boxes, dials and buttons, all in accordance to the fMRI stimuli (visual, auditory, tactile) being presented.

For example, the system would allow rating scales, selection menus, and slider bars to be incorporated within an fMRI experiment. The tablet serves as a straightforward means to interact with these controls.

To verify the fMRI-compatibility of the device, a series of experiments were performed. As previously mentioned, the MRI system has numerous factors which must be taken into account, for example, the strong static magnetic field, the dynamic spatially varying magnetic fields, and the high sensitivity to electromagnetic interference. The experiments consisted of various fMRI scans, with and without the tablet operating in the magnet bore.

Figure 6:
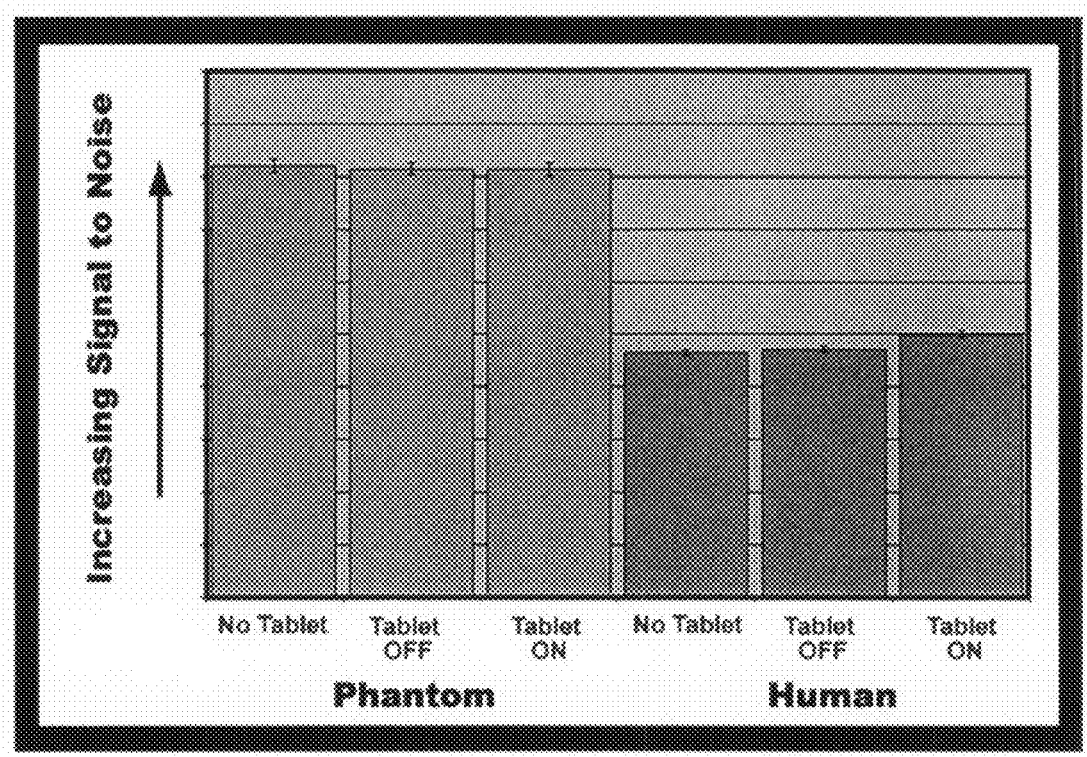
FIG. 6 displays results from a series of experiments investigating signal to noise in MR images as a function of different tablet arrangements.

As a control experiment, scans were also performed with the tablet completely removed from the magnet room. The first set of fMR images were of a water phantom, while the second set used a human subject. Anatomical and functional scanning was performed on a 3T scanner (3T94 configuration with 8-channel Excite HD software, GE Healthcare Inc.) using the standard quadrature birdcage headcoil and using the following imaging parameters:

Anatomical Acquisition (3D SPGR):
    Slice Thickness=1.4 mm
    Matrix Size=256×192
    Number of Slices=124
    TE/TR/$\theta$=4.2 ms/10.1 ms/15 deg
    Field-of-View=22 cm×16.5 cm
    Orientation=Axial Functional Acquisition (Spiral):
    Slice Thickness=5 mm
    Matrix Size=64×64
    Number of Slices=26 slices
    TE/TR/$\theta$=30 ms/2000 ms/70 deg
    Field-of-View=20 cm×20 cm
    Orientation=Axial Following each scan, images were visually examined for signal artifact. In addition, a signal to noise (SNR) value was calculated by taking the mean signal within a large central region of interest within the phantom and dividing by the standard deviation of the signal in a "background" region outside the phantom. Because SNR is related to the sensitivity of the measurements, a high SNR value is desired. The results (FIG. 6) indicate that the tablet does not reduce SNR values, both with the phantom and the human subject. In addition, no noticeable image artifacts associated with the presence of the tablet were seen in any of the images.

Representative Experiment

An fMRI Study of the Trail Making Test i) Introduction

As previously mentioned, there have been a number of studies which have investigated the neural substrates of traditional pen-and-paper neuropsychological tests. However, none of these studies employed a realistic drawing scenario. To investigate brain activity during one such test and, at the same time, test the utility of the tablet, an fMRI experiment was developed to be performed with realistic sensory input and goal-directed movements.

This particular study investigated the cerebral correlates of the Trail Making Test (TMT), a commonly used measure of frontal lobe function that includes components of scanning, visuomotor tracking, divided attention and cognitive flexibility. It has been used extensively since its development by U.S. Army psychologists as part of the Army Individual Test Battery in 1944. It is typically administered in two parts, A and B. Briefly, Part A requires the participant to link in ascending order a series of twenty-five numbers (1-2-3 . . . ) randomly distributed in space. The participant is instructed to start their "trial" at the circle marked Begin and continue linking numbers until they reach the endpoint (circle marked End). Part B is similar, although instead of just linking numbers the participant must alternately switch between a set of numbers (1-13) and a set of letters (A-L), again linking in ascending order (1-A-2-B . . . ). At the same time, the participant is also asked to connect the array of circles "as fast as possible" without lifting their pencil.

Given the extensive use of the TMT it is of interest to clinicians and researchers to have a complete understanding of the neurological underpinnings of the test. A previous fMRI study used a verbal adaptation of the TMT [Moll, J., et al. The cerebral-correlates of set-shifting: an fMRI study of the trail making test. Arquivos De Neuropsiquiatria, 60(4), 900-905, 2002.] However, it remains unclear whether the traditional paper and pencil version of the TMT involves similar brain activity. Moreover, limitations of the vTMT have been noted [Ruchinskas, R. A. (2003). Limitations of the Oral Trail Making Test in a mixed sample of older individuals. The Clinical Neuropsychologist, 17(2), 137-142.], indicating that an fMRI study of a more realistic version of the traditional TMT is required. This has been attempted previously with an fMRI-compatible tablet and stylus apparatus [Zakzanis, K. K., Mraz, R., and Graham, S. J. An fMRI study of the Trail Making Test. Neuropsychologia 43, 1878-1886, 2005], revealing distinct left-sided dorsolateral and medial frontal activity when comparing Part B versus Part A, in agreement with other scientific literature. Other activity was also observed (left middle and superior temporal gyrus) reinforcing that the brain-behavior correlations for the TMT are multifaceted and not restricted to the frontal lobe.

However, the application and extension of this work is somewhat limited, given the non-ideal characteristics of the fMRI-compatible stylus and tablet that was utilized. In the study, Mraz et al. (2005) used ShapeTape™ (MeasureAnd, Inc.) an fMRI-compatible device consisting of a set of fibre-optic twist and bend sensors located within a mylar tape as a form of position-tracking system. One end of the tape was anchored to the patient table of the MRI system, and this enabled the position of the tip of the tape to be tracked in three spatial dimensions and time. The last several inches of the tape was contained within a stylus containing a microswitch. When the microswitch indicated contact with a plastic writing surface, the stylus tip coordinates were projected onto a two-dimensional plane for representation as writing and drawing motions on a computer display screen, projected to the user via fMRI-compatible goggles (Avotec, Inc.).

The present apparatus and method described in the present application are significantly different from that developed by Mraz et al. (2005). The fiberoptic position tracking technology displayed considerably poorer spatial accuracy than achievable with touch-screen technology, to the degree that the user strongly perceived the disparity between the writing and drawing motions of the stylus in space and what was represented on the display screen. This significantly reduced behavioural performance, likely introduced unwanted learning effects, and affected the ability to record brain activity that was a true reflection of writing and drawing motions in the real world, possibly resulting from the fact that the user had to pay more attention to use of the stylus and tablet and less on the cognitive demands associated with the TMT. Furthermore, the fibre optic tape technology produced position tracking data that were influenced significantly by thermal drift, requiring recalibration every several minutes, and were also dependent on the conformation of the tape, even if the tip of the tape was located in the same position in tape. The present device and method, in which all the position tracking capability is located within the touch screen and not within the stylus, exhibits none of these limitations and represents a completely alternative approach. The resistive touch screen is highly accurate and insensitive to drift, and its integration with an ergonomic table frame makes the approach much more practically applicable and reflective of the brain activity of interest than the previous method.

ii) Materials and Methods

The traditional TMT, as described in the Introduction, was modified slightly for the purposes of fMRI. Parts A and B were repeated 4 times as part of a block task design using a different random pattern of numbers/letters in each block. Interspersed between each TMT task block was a rest period. Each part was presented in 45 s blocks and alternated with 45 s blocks of fixation, during which the participant (a young, right-handed female adult, 31 years of age with no known neurological or psychiatric impairment) was asked to remain motionless and stare at a centrally presented crosshair. Two 6:20 min. scanning runs were performed with each run having 4 stimulus periods, 4 rest periods and 20 s of "dead time" at the onset of scanning to ensure that the fMRI signal was at equilibrium prior to the onset of TMT behaviour. The participant used the fMRI-compatible drawing tablet as previously described and received visual input via a pair of MR-compatible goggles.

Functional MRI experiments were conducted on a research-dedicated whole-body 3.0 T MRI system (MAGNETOM TIM Trio, Siemens AG) using a quadrature bird-cage head coil. To serve as an anatomical underlay for the brain activation maps, a high-resolution 3D anatomical dataset was also acquired prior to functional scanning. The imaging parameters for both scans were as follows:

Anatomical Acquisition (3D MPRAGE):
 Slice Thickness=1 mm
 Matrix Size=256×192
 Number of Slices=160
 TE/TR/θ=3.05 ms/2000 ms/9 deg
 Field-of-View=25.6 cm×19.2 cm
 Orientation=Axial Functional Acquisition (Gradient Echo EPI):
 Slice Thickness=5 mm
 Matrix Size=64×64
 Number of Slices=28 slices
 TE/TR/θ=30 ms/2000 ms/90 deg
 Field-of-View=24 cm×24 cm
 Orientation=Axial Images of brain activity were calculated using a freeware package called "Analysis of Functional Neuroimages" (AFNI v2.55j; Cox, 1996). The first ten time points (20 seconds) in the time series for each experimental run were discarded to eliminate the fMRI signal decay associated with magnetization reaching equilibrium, and also to eliminate possible head motion effects inadvertently caused by the onset of scanning. The remaining fMRI time-series data were co-registered to the first remaining time sample to correct for the confounding effects of small head motions during task performance. After co-registration, the two runs were individually detrended to remove constant, linear, and quadratic components and then concatenated together to form a single dataset. Brain activity in the form of percent signal change was estimated using a least-squares fitting of a General Linear Model to the fMRI time series data. The model included a box-car waveform as an estimate of the underlying neuronal activity and did not include linear convolution with a canonical hemodynamic response function, given the length of the stimulus and rest periods.

iii) Results

Figure 7:
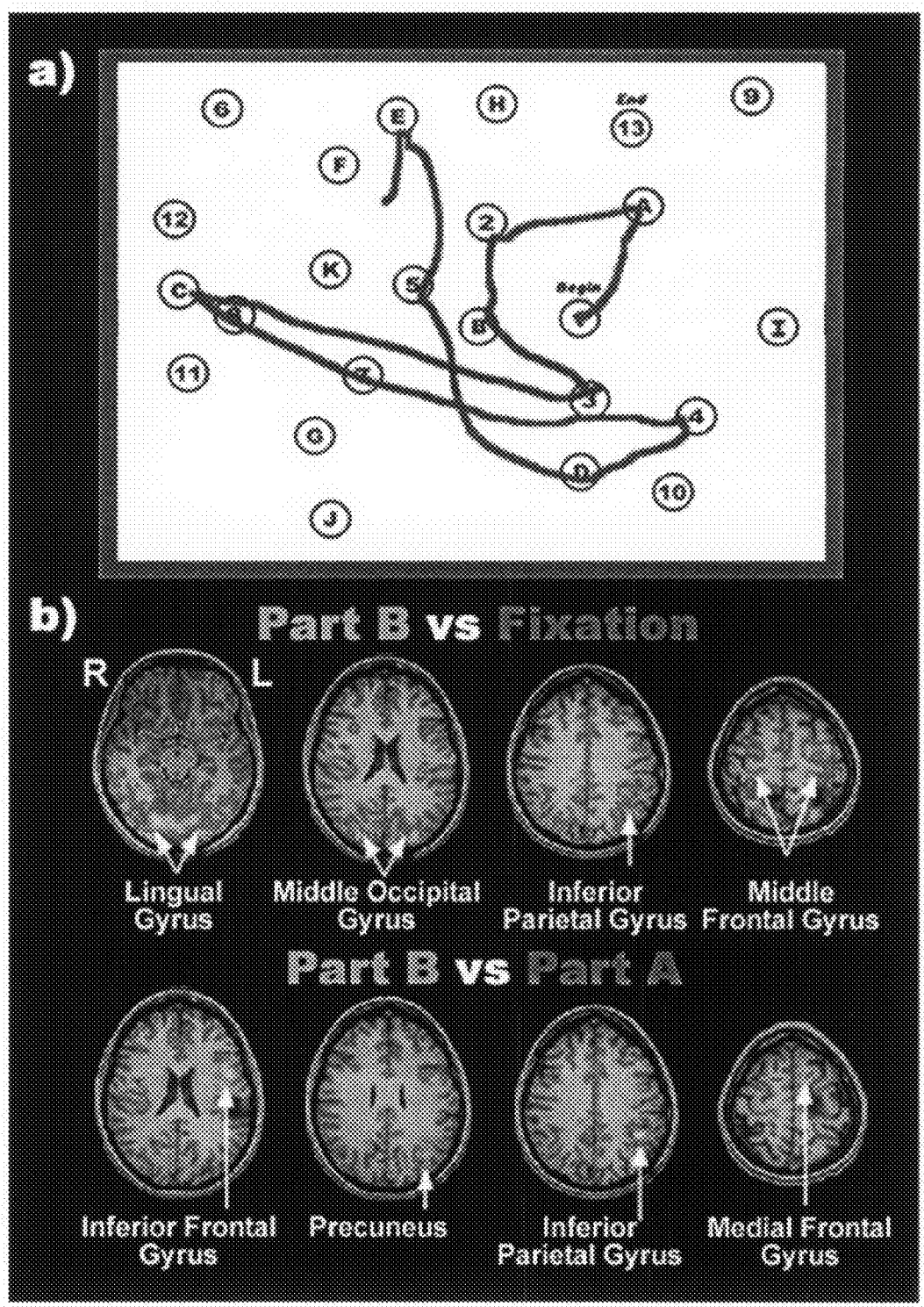
FIG. 7 shows some preliminary results from a study investigating the neural substrates of the Trail Making Test, a commonly used pen-and-paper measure of executive function. Representative behavioral results and fMRI activation maps are shown.

The participant displayed good control with the device and was able to link approximately 13 numbers for Part A and approximately 9 numbers/letters for Part B of the task (see FIG. 7a for representative trail result). The participant performed all parts of the experiment with sub-millimeter head motion yielding good fMRI data quality.

FIG. 7b shows images of brain activity for both the "Part B vs Fixation" and "Part B vs Part A" contrasts. Visually, the brain activation for "Part A vs Fixation" is quite similar to "Part B vs Fixation" and so the former is not shown. As expected, the Part B vs Fixation contrast revealed a large network of activity, including many areas associated with motor function. All the regions identified in "Part B vs Part A" showed increased activity for Part B of the experiment. These regions included primarily left-sided structures, such as the inferior frontal gyrus, medial frontal gyrus, and inferior parietal gyrus.

iv) Discussion

Although behavioral performance was somewhat less than typically obtained with the TMT, distinct left-sided dorsolateral and medial frontal activity was revealed when comparing Part B versus Part A. These findings agree with existing literature showing sensitivity of the TMT to frontal regions in the left hemisphere. However, other activity was also observed (left middle and superior temporal gyrus) reinforcing the underappreciated fact that the brain-behavior correlations for the TMT are multifaceted and are not restricted to the frontal lobe.

The above preliminary results highlight the utility of the tablet for unraveling some of the neurological underpinnings of the TMT through fMRI studies. More broadly, they indicate that with trivial software modifications, the tablet can be used very flexibly to undertake the diverse applications envisaged.

As used herein, the terms "comprises", "comprising", "includes" and "including" are to be construed as being inclusive and open ended, and not exclusive. Specifically, when used in this specification including claims, the terms "comprises", "comprising", "includes" and "including" and variations thereof mean the specified features, steps or components are included. These terms are not to be interpreted to exclude the presence of other features, steps or components.

The foregoing description of the preferred embodiments of the invention has been presented to illustrate the principles of the invention and not to limit the invention to the particular embodiment illustrated. It is intended that the scope of the invention be defined by all of the embodiments encompassed within the following claims and their equivalents.

Therefore what is claimed is:

1. A system for computerized drawing and writing during functional magnetic resonance imaging (fMRI) of a user's brain by an MRI scanner located in an electromagnetically shielded enclosure for mapping the user's brain activity during a behavioral task, comprising:
   a) an fMRI-compatible touch-sensitive tablet having a touch-sensitive surface configured to detect user input while the user is subject to functional magnetic resonance imaging (fMRI);
   b) an fMRI-compatible tablet support mounted on a patient table, said touch-sensitive tablet being mounted on said tablet support, said tablet support including an adjustment means for ergonomically accessing the touch-sensitive tablet by the user;
   c) an fMRI-compatible visual display mechanism for displaying to the user an input made by the user on the touch-sensitive tablet; and
   d) a microprocessor controller connected to said visual display mechanism and said touch-sensitive tablet, said microprocessor controller being located outside the electromagnetically shielded enclosure, said microprocessor controller configured to convert the user's input to said touch-sensitive tablet into visual stimuli displayed on said visual display mechanism, log the input into temporal and two dimensional spatial coordinates, and interpret the input associated with the behavioral behavior task under fMRI investigation.

2. The system according to claim 1 wherein said fMRI-compatible visual display mechanism comprises fMRI-compatible goggles mounted on the MRI system.

3. The system according to claim 1 wherein said visual display mechanism comprises a projector and projector screen and associated optics permitting the user to observe the projector screen.

4. The system according to claim 1 wherein said further comprising an fMRI-compatible stylus for interacting with the touch-sensitive surface for entering input thereto.

5. The system according to claim 4 wherein said fMRI-compatible stylus includes a hand held stylus having a contact surface which makes contact with said touch-sensitive surface.

6. The system according to claim 5 wherein said hand held stylus having a contact surface includes a micro switch located on said contact surface configured such that when in contact with said touch-sensitive surface of said touch-sensitive tablet the micro switch is activated indicative of contact being made between said stylus and said touch-sensitive surface, and wherein said hand held stylus is connected to said microprocessor controller.

7. The system according to claim 4 wherein said fMRI-compatible stylus includes wearable apparel having a localized interaction point for interacting with said touch-sensitive surface.

8. The system according to claim 1 wherein said microprocessor controller is further configured to replay responses of the user.

9. The system according to claim 1 wherein said fMRI-compatible touch-sensitive tablet is connected to an fMRI-compatible interface located in the electromagnetically shielded enclosure, said fMRI-compatible interface being connected to said microprocessor controller.

10. The system according to claim 9 wherein said fMRI-compatible interface converts electrical signals received from said fMRI-compatible touch-sensitive tablet into optical signals, including an optical fiber connecting said fMRI-compatible interface to an optoelectronic stage outside of the electromagnetically shielded enclosure incorporated within said microprocessor controller.

11. The system according to claim 9 wherein said fMRI-compatible interface converts signals received from said fMRI-compatible touch-sensitive tablet into wireless signals, said fMRI-compatible interface including transmitting means for transmitting the wireless signals to said microprocessor controller.

12. The system according to claim 1 wherein said adjusting means is configured to provide adjustment of orientation and placement of the touch sensitive said touch-sensitive tablet with respect to the user.

13. The system according to claim 1 wherein said table support includes an articulating frame for adjusting the orientation and placement of said touch-sensitive surface.

14. The system according to claim 1 wherein said microprocessor controller is further configured to be record, display, store, analyze, replay and timestamp all movements detected by said touch-sensitive tablet.

15. The system according to claim 1 including stimulating means for presenting sensory stimuli to the user according to task requirements during fMRI.

16. The system according to claim 15 wherein the sensory stimuli are any one or combination of visual, auditory, or tactile.

17. A method for computerized drawing and writing during functional magnetic resonance imaging (fMRI) of a user's brain by an MRI scanner located in an electromagnetically shielded enclosure for mapping the user's brain activity during a behavioral task, comprising:
   a) placing a user on a patient table and inserting the user into a bore of the MRI scanner, the patient table including an fMRI-compatible touch-sensitive tablet configured to detect user input while the user is subject to functional magnetic resonance imaging (fMRI), the touch-sensitive tablet being mounted on a tablet support, the tablet support including adjusting means for ergonomically accessing the touch-sensitive tablet by the user;
   b) during functional magnetic resonance imaging (fMRI) the user interacting with the touch-sensitive tablet for entering input thereto;
   c) displaying to the user the input entered by the user on the touch-sensitive tablet;
   d) converting responses of the user input to the touch-sensitive tablet into visual stimuli displayed on a visual display mechanism,
   e) logging the input into temporal and two dimensional spatial coordinates, and
   f) interpreting the input associated with the behavioral task under fMRI investigation.

18. The method according to claim 17 wherein said step c) of displaying to the user the input entered by the user on the touch-sensitive tablet is achieved using fMRI-compatible goggles mounted on the MRI system.

19. The method according to claim 17 wherein said step c) of displaying to the user the input entered by the user on the touch-sensitive tablet is achieved using a projector and projector screen and associated optics permitting the user to observe the projector screen.

20. The method according to claim 17 wherein said step b) of the user interacting with the touch-sensitive tablet involves the use of an fMRI-compatible stylus.

21. The method according to claim 20 wherein the fMRI-compatible stylus includes a hand held stylus having a contact surface which makes contact with the touch-sensitive tablet.

22. The method according to claim 21 wherein the hand held stylus having a contact surface includes a micro switch located on the contact surface configured such that when in contact with the touch-sensitive surface the micro switch is activated indicative of contact being made between the stylus and the touch-sensitive tablet, and wherein the hand held stylus is connected to the microprocessor controller.

23. The system according to claim 20 wherein the fMRI-compatible stylus includes wearable apparel having a localized interaction point for interacting with the touch-sensitive tablet.

24. The method according to claim 17 including replaying responses of the user.

25. The method according to claim 17 including recording, displaying, storing, analyzing, replaying and timestamping all movements detected by the touch-sensitive tablet.

26. The method according to claim 17 including presenting sensory stimuli to the user according to task requirements during fMRI.

27. The method according to claim 17 wherein the sensory stimuli are any one or combination of visual, auditory, or tactile.

28. The method according to claim 17 wherein the fMRI-compatible touch-sensitive tablet is connected to an fMRI-compatible interface located in the electromagnetically shielded enclosure.

29. The method according to claim 28 including the fMRI-compatible interface converting electrical signals received from the fMRI-compatible touch-sensitive tablet into optical signals, and transmitting optical signals to an optoelectronic stage incorporated within a microprocessor controller configured to perform step e) located outside of the electromagnetically shielded enclosure in which the MRI scanner is located.

30. The method according to claim 28 including the fMRI-compatible interface converting electrical signals received from the fMRI-compatible touch-sensitive tablet into wireless signals, the fMRI-compatible interface including transmitting means for transmitting said wireless signals to a microprocessor controller located outside of the electromagnetically shielded enclosure in which the MRI scanner is located, and said microprocessor configured to perform step e).

* * * * *